(12) United States Patent
Sauerwine et al.

(10) Patent No.: US 8,564,299 B2
(45) Date of Patent: Oct. 22, 2013

(54) BATTERY CONFIRMATION SYSTEM AND METHOD FOR CONFIRMING STATE OF CHARGE IN VEHICLE BATTERY

(75) Inventors: Dean S. Sauerwine, Hilliard, OH (US); Christopher D. Kroenke, Columbus, OH (US); Derrick I. Cobb, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 409 days.

(21) Appl. No.: 12/946,691

(22) Filed: Nov. 15, 2010

(65) Prior Publication Data

US 2012/0119747 A1    May 17, 2012

(51) Int. Cl.
*G01N 27/416* (2006.01)
(52) U.S. Cl.
USPC .......................................... 324/432; 324/426
(58) Field of Classification Search
None
See application file for complete search history.

(56) References Cited

U.S. PATENT DOCUMENTS

| 5,950,144 | A | 9/1999 | Hall et al. |
| 5,950,149 | A | 9/1999 | Fieramosca et al. |
| 6,211,653 | B1 | 4/2001 | Stasko |
| 6,522,148 | B2 | 2/2003 | Ochiai et al. |
| 6,647,323 | B1 * | 11/2003 | Robinson et al. ................. 701/1 |
| 6,795,782 | B2 | 9/2004 | Bertness et al. |
| 7,039,533 | B2 | 5/2006 | Bertness et al. |
| 7,058,525 | B2 | 6/2006 | Bertness et al. |
| 7,505,856 | B2 | 3/2009 | Restaino et al. |
| 7,598,744 | B2 * | 10/2009 | Bertness et al. .............. 324/426 |
| 2006/0091848 | A1 | 5/2006 | Braun et al. |

FOREIGN PATENT DOCUMENTS

| CA | 2104419 | 2/1994 |
| DE | 102008040194 | 1/2010 |
| DE | 102008041546 | 3/2010 |
| EP | 1319956 | 6/2003 |
| KR | 100836408 | 7/2007 |
| WO | 2005111642 | 11/2005 |

* cited by examiner

Primary Examiner — Minh N Tang
(74) Attorney, Agent, or Firm — Rankin Hill & Clark LLP (57) ABSTRACT

A battery confirmation system and method for confirming a state of charge in a vehicle battery installed in a vehicle includes a vehicle having a controller, a battery powering the controller, and an onboard diagnostics connector operatively connected to the controller. A tester is connectable to the onboard diagnostics connector. The tester is configured to receive a vehicle operating voltage from the connector when an electrical load on the battery is within a predetermined load range and to determine a SOC value based on the vehicle operating voltage.

21 Claims, 5 Drawing Sheets

BATTERY CONFIRMATION SYSTEM AND METHOD FOR CONFIRMING STATE OF CHARGE IN VEHICLE BATTERY

BACKGROUND

The present disclosure generally relates to vehicle batteries, and more particularly relates to a battery confirmation system and method for confirming a state of charge in a vehicle battery installed in a vehicle, such as immediately before the vehicle exits a manufacturing assembly line and/or plant.

Vehicle manufacturers often desire to confirm that production vehicles are shipped from the manufacturing facility in good condition. This includes confirming that production vehicles are shipped with their vehicle batteries having at least a minimum state of charge. The purpose for such confirmation is to attempt to limit the number of warranty claims related the battery (i.e., prevent under specification batteries from being shipped on new vehicles). One existing method for confirming the state of charge (SOC) in the battery of a production vehicle is the hydrometer check method. In this method, a specific gravity metering device (i.e., a hydrometer), such as a plastic ball with a precisely controlled density, can be used to detect a low state of charge battery based on the specific gravity of the electrolyte contained within the battery.

In particular, the ball can be located in a single cell of the battery. A sight glass window is provided on the battery's outer surface adjacent the single cell so that the ball is viewable when the specific gravity of the battery cell is at a specified level correlated to the density of the ball so that the ball floats. When the ball floats, ball can be seen through the sight glass window, and such sighting is used to indicate that the battery has a sufficient state of charge. Should the specific gravity fall below a predetermined level (e.g., 1.20), the ball will fall and window will turn another color (e.g., black). Visual confirmation of the ball in the sight glass window on the battery, or lack of such visual confirmation, provides an indication of whether the vehicle battery has the sufficient state of charge in that particular cell.

Advantageously, the hydrometer check method supplies an indication of the state of charge of the battery very quickly. That is, the hydrometer check method provides a quick visual indication of whether the battery has a sufficient state of charge. This is particularly beneficial in an assembly line environment where there may be only a very limited amount of time to confirm that the battery is in good condition.

Unfortunately, a drawback of the hydrometer check is that it has been found to be only marginally reliable. For example, most production vehicle batteries contain a plurality of cells (e.g., six cells) but the hydrometer test only occurs in connection with one of the plurality of cells. As a result, the hydrometer test only confirms that the specific gravity of one of the plurality of cells is at a correct level. This can be a problem when there is a variance in the state of charge between cells in a battery. Another drawback of the hydrometer check method is that its margin of error is significant. In particular, the ball may float confirming that the battery is supposedly with an adequate state of charge when in fact the state of charge could be lower than desired. Also, battery related claims currently can be one of the largest warranty items for production vehicles. Such claims can result from production vehicles being shipped from the manufacturing facility with a low state of charge. An additional drawback of the hydrometer method is that there is currently no traceability to the vehicle in which the battery is included. Therefore, the vehicle might be shipped after successful hydrometer check. However, when a later warranty item occurs in connection with the vehicle, there is no way for the vehicle manufacturer to show that the vehicle was shipped with a battery having an adequate state of charge.

Several more accurate battery testing methods are known. However, many of these require the battery to be disconnected from the vehicle and/or are unsuitable for a manufacturing environment. In particular, many battery test methods require expensive equipment and/or more time than is afforded on a vehicle production line.

SUMMARY

According to one aspect, a battery confirmation method is provided for confirming a state of charge in a vehicle battery installed in a vehicle. In the method according to this aspect, a tester is connected to an on-board diagnostics connector of the vehicle. A vehicle operating voltage is obtained from the on-board diagnostics connector when an electrical load measurement is within a predetermined load range. A state of charge (SOC) value can be determined based on the vehicle operating voltage.

According to another aspect, a battery confirmation system for confirming a state of charge in a battery includes a vehicle having a controller, a battery powering the controller and an on-board diagnostics connector operatively connected to the controller. The system further includes a tester connectable to the on-board diagnostics connector. The tester is configured to receive a vehicle operating voltage from the connector when an electrical load on the battery is within a predetermined load range and to determine a SOC value based on the vehicle operating voltage.

According to a further aspect, a method is provided for confirming state of charge in vehicles exiting a production line. In the method according to this aspect, a line-end tester is connected to an controller of each of the vehicles through an on-board diagnostics connector operatively connected to the controller. An electrical load measurement is obtained from the controller through the on-board diagnostics connector for each vehicle. A vehicle operating voltage measurement is also obtained from the controller through the on-board diagnostics connector for each vehicle when the electrical load measurement is within a predetermined range. A SOC value is determined for each vehicle based on the vehicle operating voltage measurement and each vehicle is passed or failed based on the SOC value.

DETAILED DESCRIPTION

Figure 1:
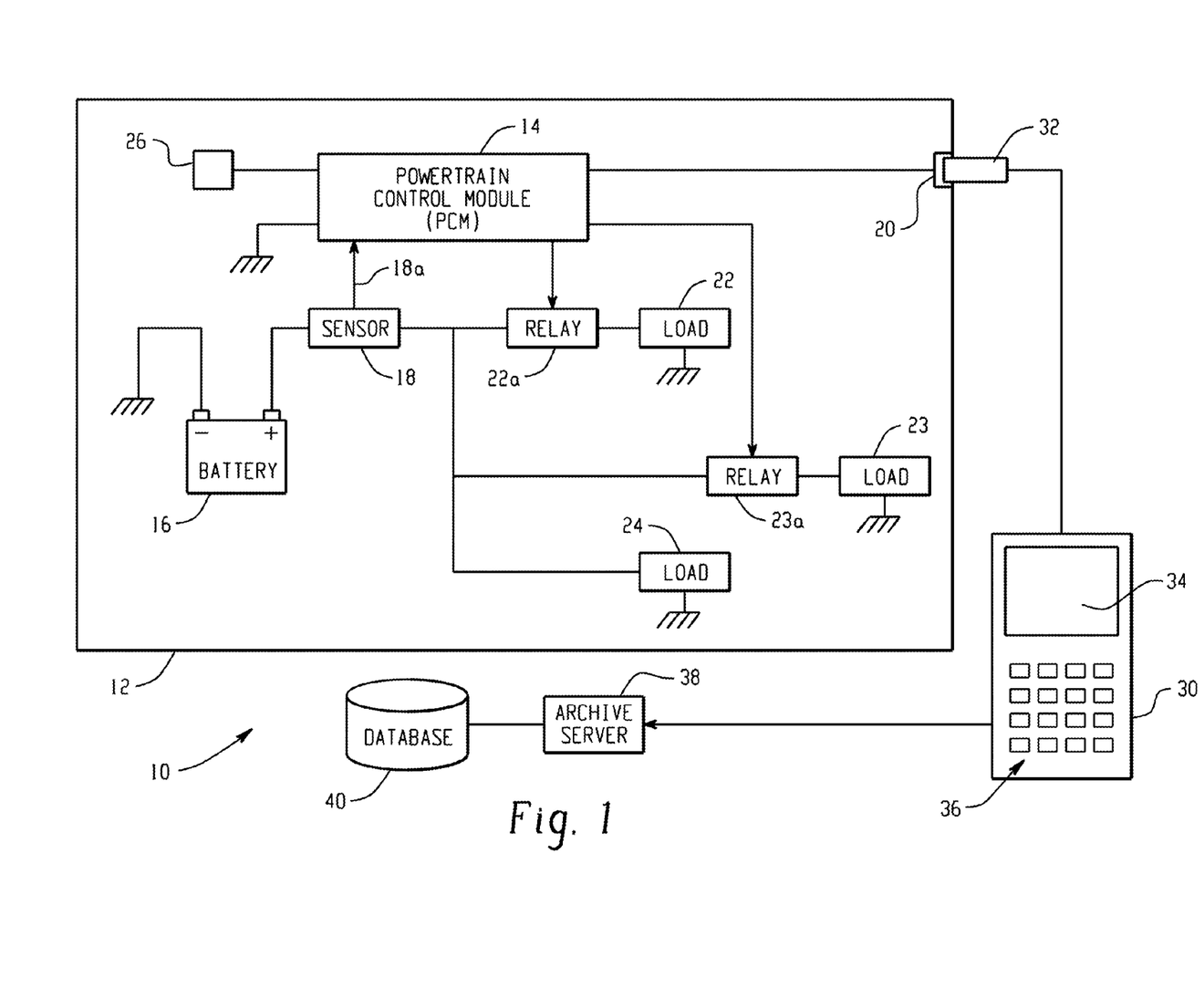
FIG. 1 is a schematic view of a battery confirmation system for confirming a state of charge in a battery of a vehicle.

Referring now to the drawings wherein the showings are for purposes of illustrating one or more exemplary embodiments and not for purposes of limiting same, FIG. 1 shows a battery confirmation system for confirming a state of charge in a vehicle's battery, the system generally indicated by reference numeral 10. The system 10 of the illustrated embodiment includes a vehicle 12 having a vehicle controller 14, a battery 16 powering the controller 14 and various other loads of the vehicle 12, a sensor 18 for obtaining an electrical load measurement (EL) of the battery 16 and a voltage measurement (Vb) of the vehicle 12 while the battery 16 is under load. The vehicle 12 also includes an on-board diagnostics (OBD) connector 20 operatively connected to the controller 14 for transmitting the electrical load measurement (EL) and the vehicle operating voltage measurement (Vb) of the battery 16 as determined by the sensor 18. The battery 16 can be a conventional battery, such as a 12 volt battery, installed in the vehicle on a production line and used to power the various electrical devices/loads of the vehicle 12. In the illustrated embodiment, the controller 14 is the vehicle's PCM (powertrain control module), though it is to be appreciated that the controller 14 can be any controller or control unit in the vehicle 12 (or multiple controllers) capable of measuring the electrical load on the battery 16 and the vehicle operating voltage (Vb).

A plurality of loads, including illustrated loads 22, 23, 24, can be electrically connected to the battery 16, such as by the controller 14. The loads 22, 23, 24 can be various electrical consuming devices or groups of devices within the vehicle. For example, the loads can include the vehicle's headlights, radiator fan, condenser fan, rear defogger, brake lights, tail lights, interior lighting, the entertainment or sound system of the vehicle, navigational systems and displays or other displays (e.g., a rear entertainment screen), heated seats, ventilation blower, backup (+B) functions, etc. The controller 14 or other controllers of the vehicle 12 can operate optional relays 22a, 23a to electrically connect or disconnect the loads 22, 23 from the battery 16. In one embodiment, the first load 22 is a load or loads used to add a predetermined amount of load on the battery 16 as will be described below in more detail.

Optionally, the load 22 and/or load 23 can be accessory loads that are operable when an ignition switch 26 (or other accessory mode operator) is selectively moved to an accessory ON position or a run position wherein the vehicle 12 is placed in a corresponding accessory ON mode or run mode, both allowing the accessory loads to receive power from the battery 16 irrespective of the on/off state of the vehicle 12. The third load or loads 24 can be, for example, loads that remain electrically connected to the battery 16 regardless of the state of the ignition switch and/or the on/off state of any particular system. These could include, for example, the backup (+B) functions of the vehicle. Though the illustrated vehicle 12 is shown with only three loads 22, 23, 24, it is of course to be appreciated and understood by those skilled in the art that any number of loads could be included on the vehicle 12.

As is known and understood by those skilled in the art, the controller 14 can be implemented by a microcomputer comprised of a CPU, a ROM for storing various operating programs or modules to be executed by the CPU, a RAM for storing the results of computations or the like by the CPU and any number of input/output interfaces, including the OBD connector 20 shown in FIG. 1. In addition to coordinating operation of the vehicle 12, the controller 14, whether centralized or distributed, can obtain and store data obtained about the condition of the battery 16, such as from the sensor 18.

In one embodiment, the controller 14 receives battery signal or signals 18a from the sensor 18, the signal or signals representative of a condition of the battery 16. In particular, the sensor 18 can be electrically connected to the battery 16 for determining the condition of the battery 16 and generating the signal or signals 18a representative thereof to send to the controller 14. In an exemplary embodiment, the sensor 18 can measure the electrical load on the battery 16 and the voltage output by the battery while under the electrical load. In particular, the sensor 18 can take an electrical load measurement (EL) of the battery 16 and communicate this as signal 18a to the controller 14 and can take a vehicle operating voltage measurement (Vb) of the battery 16 and send this as another signal 18a to the controller 14.

The OBD connector 20 can be a conventional OBD connector, such as a conventional OBDII socket or pin connector that allows external devices to communicate with the controller 14. For example, the connector 20 can allow a diagnostics tool to connect to the controller 14 for retrieving various data stored by the controller related to the components and/or systems of the vehicle 12. Alternatively, the connector 20 can be some other type of connector that would allow for communications with the controller and/or vehicle 12. This could include allowing for wireless connections, optical connections, etc. The battery confirmation system 10 of FIG. 1 can additionally include a tester 30 connectable to the on-board diagnostics connector 20 for communicating with the controller 14. In particular, in the illustrated embodiment, the tester 30 can include an OBD connector 32 that is connectable to the connector 20 of the vehicle 12. Accordingly, connecting the connector 32 to the connector 20 of the vehicle 12 allows the tester 30 to communicate with the controller 14. Where the connector 20 is other than a conventional OBD connector, the connector 32 of the tester 30 can be otherwise configured for connecting to the connector 20, whether a hard wired connection, wireless or otherwise, to enable communications between the controller 14 and the tester 30.

As would be described in more detail below, the tester 30 can be configured to receive the electrical load measurement (EL) from the controller 14 (i.e., the electrical load measurement of the battery 16 taken by the sensor 18 representative of the current or amperage load on the battery 16, such as from loads 22, 24) and to determine whether the electrical load measurement (EL) is within a predetermined load range. The tester 30 can be further configured to receive the vehicle operating voltage from the connector 20 when an electrical load on the battery 16 is within the predetermined load range. In one embodiment, the tester 30 receives a vehicle operating voltage measurement representative of the vehicle operating voltage from the controller 14 when the electrical load measurement (EL) is within the predetermined load range. Alternatively, the tester 30 can be configured to receive the vehicle operating voltage directly from the connector 20 (i.e., not a value stored by the controller 14) while the battery 16 is operated at a known load. In any case, the tester 30 can determine a state of charge (SOC) value based on the vehicle operating voltage.

With the SOC value, the tester 30 can include a display 34 that displays a pass indication when the SOC value is greater than (or greater than or equal to) a predetermined SOC pass value and/or display a fail indication when the SOC value is less than (or less than or equal to) the predetermined SOC pass value. As will be described in more detail below, the SOC value can be the percentage and the SOC pass value can be a pre-set percentage. Accordingly, the pass indication can be displayed on the display 34 when the SOC value percentage is greater than (or greater than or equal to) the predetermined SOC pass value percentage and/or the fail indication can be displayed on the display 34 when the SOC value percentage is less than (or less than or equal to) the predetermined SOC pass value percentage. In addition, the tester 30 can include any number of hard buttons 36 allowing an operator to control the tester 30. If desired, the display 34 can be a touch-type display that allows for data input through the display 34.

Additionally, and as will be described in more detail below, the tester 30 can be further configured to command the controller 14 to adjust an electrical load condition on the battery 16 in the vehicle 12 when the electrical load measurement (EL) of the battery 16 as taken by the sensor 18 is outside the predetermined load range. For example, the tester 30 can command the controller 14 to change an on/off state of one of the loads 22, 23 to thereby adjust the electrical load condition on the battery 16. The load 22 can be, for example, the high beam headlights on the vehicle 12 and the tester 30 can command the controller 14 to turn on the high beam headlights load 22 when the electrical load measurement (EL) is lower than the predetermined load range. Also, for example, the tester 30, through the display 34, can indicate to an operator to manually turn on or off loads, such as loads 22, 23, to change the electrical load condition on the battery 16.

To determine the SOC value based on the vehicle operating voltage measurement, the tester 30 can be configured to compare the vehicle operating voltage measurement (Vb) to a specific battery load characteristic curve corresponding to the battery 16. The specific battery load characteristic curve can be selected from a plurality of battery low characteristic curves based on the battery 16 in the vehicle. For example, a particular size and/or brand of battery can have a particular battery load characteristic curve associated therewith and such curve can be used to determine the SOC value based on the vehicle operating voltage measurement. The battery load characteristic curve can be stored in a memory of the tester 30 and can be represented by various software and/or programming of the tester 30 (e.g., the battery load characteristic curve can be modeled by a look-up table, if desired). The particular battery load characteristic curve, and the battery load characteristic curves in general, can be temperature specific such that they are most effective when the battery 16 is at a specified temperature correlating to the particular battery load characteristic curves.

Still further, the tester 30 can be configured to receive a VIN number stored by the controller 14 corresponding to the vehicle 12 and associate the VIN number with the electrical load measurement (Vb) and the vehicle operating voltage measurement (EL) taken by the sensor 18 and communicated from the controller 14 through the connector 20 and to the tester 30. The system 10 can further include an archive server 38 operatively connectable to the tester 30, such as through a wired or wireless connection, for receiving and archiving the VIN number, the electrical load measurement and the vehicle operating voltage measurement. In one embodiment, the archive server 38 has or is connected to a database 40 for storing and archiving the VIN number, the electrical load measurement and the vehicle operating voltage measurement.

With additional reference to FIG. 2, an exemplary battery confirmation method for confirming a state of charge in a vehicle battery installed in a vehicle will now be described. In particular, the method of FIG. 2 will be described in association with the battery confirmation system illustrated in FIG. 1, though it is to be appreciated that the battery confirmation method could be used with other systems. In the method, the tester 30 is first connected in S100 to the on-board diagnostics connector 20 of the vehicle 12. As already described herein above, this can include connecting the OBD connector 32 of the tester 30 to the OBD connector socket 20 of the vehicle 12 for establishing a communications link between the tester 30 and the controller 14.

Once connected, an electrical load measurement (EL) can be obtained in S102 by the tester 30 from the controller 14 through the OBD connector 20. In an exemplary embodiment, this is done while an engine of the vehicle 12 is turned off and the vehicle is in an accessory ON mode (e.g., the ignition key or unit is operated to allow the battery 16 to supply power to various accessory loads). In particular, the sensor 18 can take the electrical load measurement (EL) from the battery 16 and communicate this as a signal 18*a* to the controller 14. The tester 30 then extracts the electrical load measurement (EL) as determined by the sensor from the controller 14. Alternatively, the electrical load measurement (EL) need not be taken when other means are available to confirm that the load is within a predetermined load range.

Next, in S104, the tester 30 can obtain a vehicle operating voltage from the connector 20. This could include obtaining a vehicle operating voltage measurement representative of the vehicle operating voltage from the controller 14 through the OBD connector 20 when the electrical load measurement is within a predetermined load range. Should the electrical load measurement (EL) obtained in S102 be determined to be outside the predetermined load range, certain additional steps can be taken, as discussed below, to adjust an electrical load condition on the battery 16. This allows a further electrical load measurement (EL) to be taken that is within the predetermined load range and then the vehicle operating voltage measurement (Vb) can be obtained while this further electrical load measurement (EL) is within the predetermined load range. Once the vehicle operating voltage is obtained, a SOC value can be determined in S106 based on the vehicle operating voltage. In one embodiment, the SOC value can be determined in S106 based on the vehicle operating voltage measurement (Vb).

Once the SOC value is determined, a pass indication can be provided on the tester 30, such as via the display 34, when the SOC value is greater than (or greater than or equal to) a predetermined SOC pass value and/or a fail indication can be provided on the tester 30, such as via the display 34, when the SOC value is less than (or less than or equal to) the predetermined SOC value. In one embodiment, the pass indication is provided when the SOC value is greater than or equal to the SOC pass value; otherwise, the fail indication is provided. As will be described in more detail below, the SOC pass value can be pre-set to any desired value, such as 75% for example. The pass/fail indication can be used in a manufacturing assembly line environment to determine if the vehicle is ready to ship or needs further attention prior to shipping.

Figure 3:
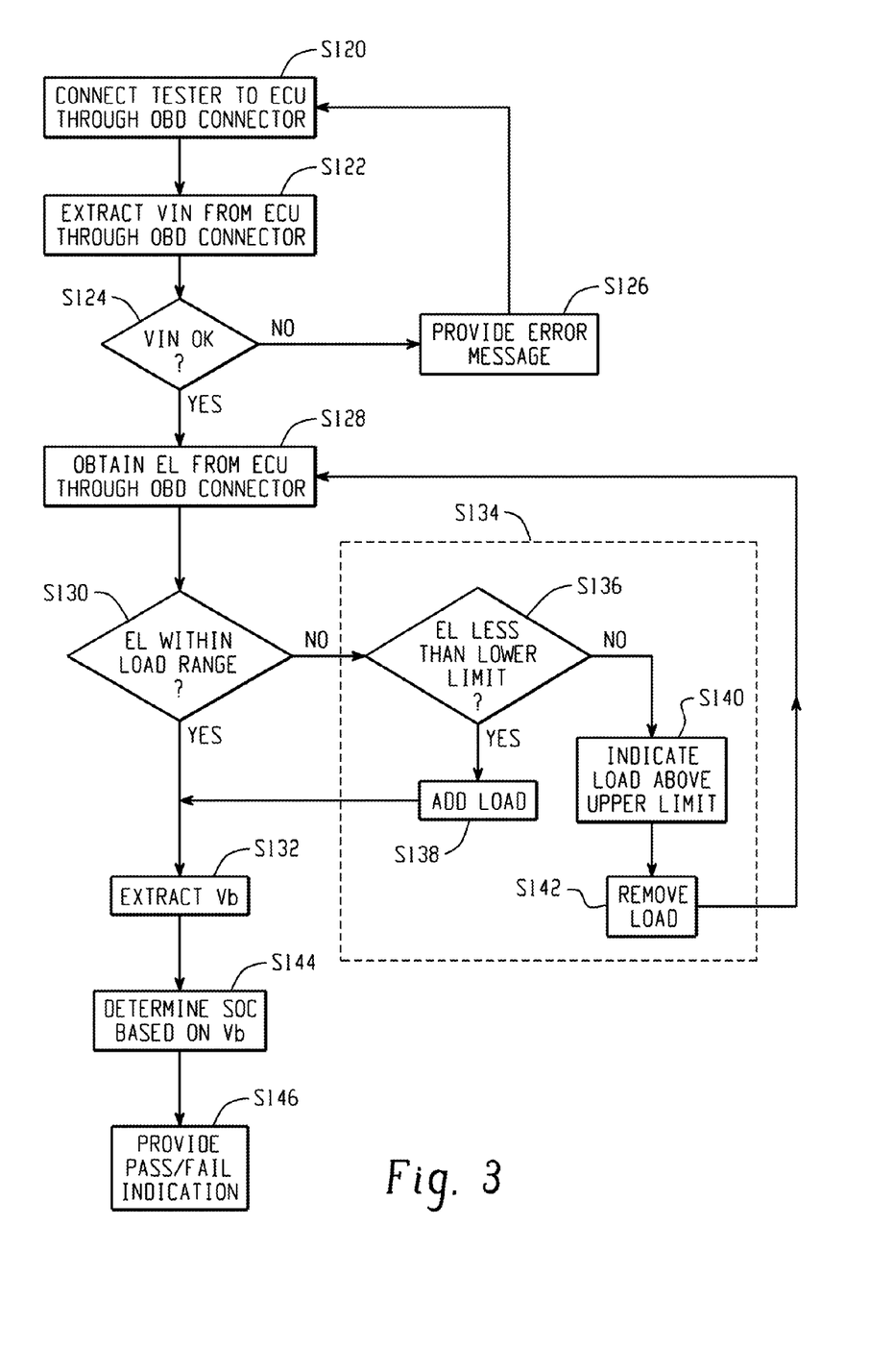
FIG. 3 is another more detailed block diagram illustrating a battery confirmation method.

Turning to FIG. 3, a battery confirmation method is shown in further detail according to one exemplary embodiment. In the method of FIG. 3, the tester 30 is connected to the controller 14 through the OBD connector 20 in S120. Again, this can include connecting the OBD connector 32 of the tester 30 into the OBD connector 20 of the vehicle 12. After connection, a VIN number of the vehicle 12 can optionally be extracted from the controller 14 in S122 through the OBD connector 20 by the tester 30. As is known and understood by those skilled in the art, the controller 14 can retain the VIN number in its memory and can provide the VIN number to the tester 30 through the OBD connector 20. This optional step can be used to confirm proper connection of the tester 30 to the OBD connector 20 and/or to associate measurements obtained by the tester 30 from the controller 14 with the vehicle 12 for archival and future retrievable, such as when processing warranty claims.

When the VIN number is extracted in S122, a determination can be made in S124 as to whether the extracted VIN was indeed extracted and is an accurate VIN number. If no, an error message can be provided in S126 and appropriate corrective action taken. For example, with the method returning to S120, the OBD connector 32 of the tester 30 can be reconnected or re-secured to the OBD connector 20 of the vehicle 12. If yes in S124, an electrical load measurement (EL) can be obtained in S128 from the controller 14 through the OBD connector 20. In an exemplary embodiment, this is done while an engine of the vehicle 12 is turned off and the vehicle 12 is in an accessory ON mode. The accessory ON mode can be a mode where one or more various accessory loads can be electrically connected to the battery and this mode can be selectively entered (e.g., by turning the ignition key or some other actuator to an accessory ON position).

Next, in S130 a determination can be made as to whether the electrical load measurement (EL) taken in S128 is within a predetermined load range. The predetermined load range can be, for example, between about 13 amps and about 19.5 amps. Accordingly, if the electrical load measurement (EL) taken S128 is greater than 13 amps and less than 19.5 amps, then it is determined to be within the predetermined load range in S130 and the method proceed to S132 wherein a vehicle operating voltage measurement (Vb) is obtained from the controller 14 by the tester 30 through the OBD connector 20. Alternatively, the tester 30 can obtain the vehicle operating voltage directly from the connector 20 (i.e., without retrieving a stored measurement from the controller 14), such as where the connector 20 is an OBD connector that includes a Vb wire or pin electrically connected to the battery 16.

In the event that the electrical load measurement (EL) is determined to be outside the predetermined load range in S130, an electrical load condition on the battery 16 can be adjusted in S134 until an electrical load measurement can be taken that is within the predetermined load range. In one exemplary embodiment, load condition adjustment within S134 can first include determining in S136 whether the electrical load measurement (EL) is below a lower limit, such as 13 amps. If yes, load (e.g., load 22 and/or load 23) can be added to the battery 16 by the controller 14 in S138. If determined that the electrical load measurement is not below the lower limit in S134, then it is known that the electrical load measurement (EL) is above the upper limit, such as 19.5 amps, because the electrical load measurement (EL) was already determined to be outside the load range in S130. In this case, the method can proceed to S140 wherein an indication can be provided that the electrical load measurement is above the upper limit. Then, load can be removed in S142 and thereafter the method returns to S126 to obtain another electrical load measurement (EL) from the controller 14 through the OBD connector 20 to determine if this additional electrical load measurement (EL) is now within the predetermined load range.

When load is added in S138, the load can be precisely determined to raise the electrical load condition of the battery such that it is known to fall within the predetermined load range. Alternatively, though not shown, after adding load in S138, the method can return to S128 to obtain an additional electrical load measurement (EL) from the controller 14 through the OBD connector 20 and then determine in S130 if this additional electrical load measurement (EL) is within the predetermined load range before advancing to S132 and extracting the vehicle operating voltage measurement (Vb) from the controller 14.

In an exemplary embodiment, adjusting the electrical load condition in S134 on the battery 16 can include automatically adjusting the electrical load condition. For example, automatically adjusting the electrical load condition on the battery 16 can include the tester 30 sending a command signal to the controller 14 through the OBD connector 20 that commands and causes the controller to change an on/off state of one or more load devices, such as loads 22, 23 of the vehicle 12, in response to the command signal. By way of example, automatically adjusting the electrical load condition could include changing the on/off state of the headlights on the vehicle 12 for a predetermined period of time where the headlights are one of the loads 22, 23. More specifically, for example, changing the on/off state of the headlights could include automatically changing the on/off state of the headlights to an on state in S133 for a predefined period of time, such as three seconds. Other exemplary loads that could be used when load is to be automatically added could include, for example, the radiator fan, the condenser fan, the rear defrost, the brake lights, etc.

In an exemplary method, load is added in S138 automatically by the tester 30 commanding the controller 14 through the OBD connector 20 to change the on/off state of one or more loads 22, 23 to an on state for a predetermined period of time and removing load in S142 is done manually. In particular, the indication that load is above the upper limit in S140 can prompt an assembly line worker to manually remove load, such as changing the on/off state of one or more loads to an off state, particularly where the one or more loads were inadvertently left in the on state. Steps 130 and S134 ensure that the vehicle operating voltage measurement (Vb) taken in S132 is a vehicle operating voltage measurement while the battery 16 is subjected to an appropriate electrical load condition.

Obtaining the vehicle operating voltage measurement (Vb) in S132 can include retrieving the vehicle operating voltage measurement (Vb) as taken by the sensor 18 and communicated and stored by the controller 14. Alternatively, a vehicle operating voltage can be obtained by the tester 30 directly from an onboard tester A/D converter (not shown) on the vehicle 12. After the controller measurement (Vb) is obtained by the tester 30 from the controller 14 through the OBD connector 20 in S132, which is after confirming in S130 that the electrical load measurement (EL) is within the predetermined load range, a SOC value can be determined in S144 for the battery 16 based on the controller measurement (Vb). As will be described in more detail below, the SOC value determined in S144 can be a value indicating the charge remaining in the battery 16 relative to a scale ranging between a low end where no charge remains in the battery 16 and a high end where the battery 16 is fully charged (or overcharged). In one embodiment, the SOC value indicates the condition of the battery 16 as relates to its overall state of charge (i.e., a value or percentage of a maximum state of charge of the battery 16). In one exemplary embodiment, the state of charge is the percentage of maximum electrical energy output of the battery 16.

With the SOC value determined in S144, a pass or fail indication can be provided in S146 on the tester 30. In particular, a pass indication can be provided on the tester 30 when the SOC value is greater than (or greater than or equal to) a predetermined SOC pass value and/or a fail indication can be provided on the tester 30 when the SOC value is less than (or less than or equal to) the predetermined SOC pass value. In one exemplary embodiment, a pass indication is provided when the SOC value is greater than or equal to the SOC pass value, which can be 75% for example; otherwise, a fail indication is provided. Accordingly, the pass indication can be given when the SOC value determined in S144 is at or above the threshold SOC pass value and/a fail indication can be given when the SOC value determined in S144 is below this threshold. The SOC pass value, which can be a percentage, can be any value selected as a threshold for indicating that the battery is in good condition and can be related to the particular chemistry of the battery. For example, the SOC pass value or threshold for a lead acid battery could be 75%, 85%, 95%, 100% or any desired percentage.

As will be described in more detail below, determining the SOC value in S144 can include comparing the vehicle operating voltage measurement (Vb) from S132, which is taken while the electrical load of measurement (EL) is within the predetermined load range, to a specific battery load characteristic curve corresponding to the vehicle battery 16 (i.e., a curve correlating vehicle operating voltage measurement taken in S132 to the SOC value). As will also be described in more detail below, determining the SOC value in S142 can further include selecting the specific battery load characteristic curve for the battery 16 from a plurality of battery load characteristic curves based on the battery 16 and the vehicle 12. The specific battery load characteristic curve can be temperature specific and may therefore be preferably used against a vehicle operating voltage measurement (Vb) taken while the battery 16 is at or near a specified temperature.

When the battery 16 is determined to fail in S144 (i.e., the SOC is below the predetermined SOC pass value, such as 75%), appropriate corrective action can be taken. In an exemplary implementation of FIG. 3, the battery 16 can be replaced and/or charged prior to the vehicle 12 leaving the manufacturing facility after production thereof. For example, the battery 16 can be charged when the SOC value is below the predetermined SOC pass value prior to the vehicle 12 being shipped from the manufacturing facility to a dealership or similar for sale and ultimate delivery to a customer.

Figure 4:
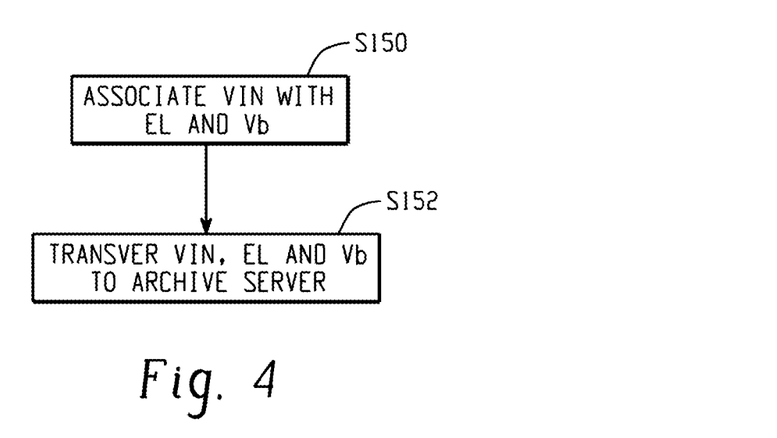
FIG. 4 is a block diagram of additional processes that can be included with the battery confirmation method of FIG. 3.

With additional reference to FIG. 4, when the VIN is extracted from the controller 14 through the OBD connector 20 in S122, the VIN number extracted to the tester 30 can be associated in S150 by the tester with the vehicle operating voltage measurement (Vb) taken in S132 and the electrical load measurement (EL) taken in S128 as measured by the tester 30. Next, in S152, the vehicle operating voltage measurement (Vb) and the electrical load measurement (EL) of the battery 16 with the associated VIN number can be transferred to an archive server, such as archive server 38 of FIG. 1. This can allow for traceability to the VIN number to evidence that the vehicle 12 and its battery 16 were shipped in good condition when leaving the manufacturing facility.

Figure 2:
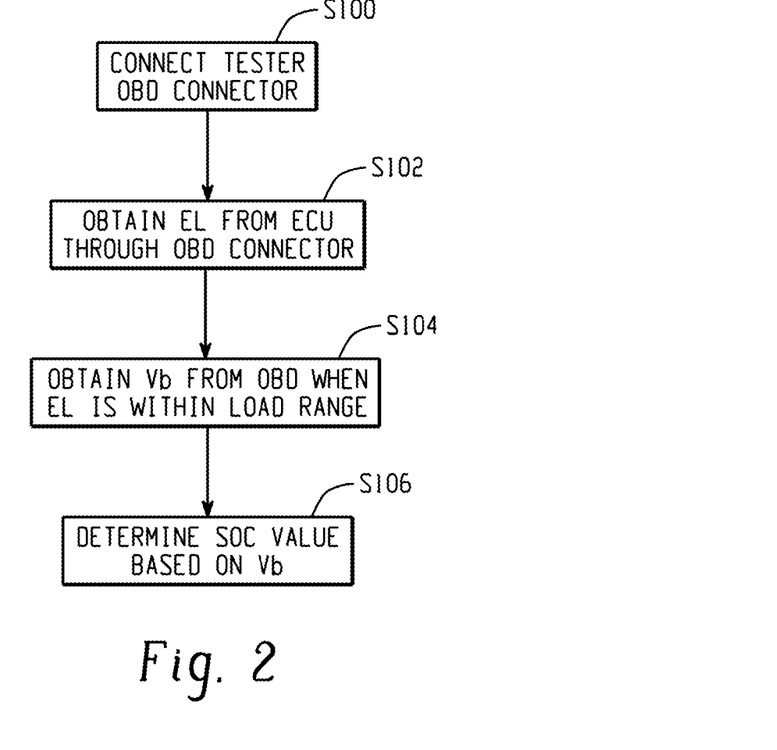
FIG. 2 is a block diagram of a battery confirmation method for confirming a state of charge in a vehicle battery installed in a vehicle.

Advantageously, the methods illustrated in FIGS. 2-4 can be done quickly and provides an accurate indication as to the true state of charge of the battery 16. These advantages make these methods particularly adaptable for use within a manufacturing facility. In particular, these methods can be used for confirming state of charge in vehicles exiting a production line. In such an environment, a line-end tester can serve as the tester 30 and can be connected to the controller of each of the vehicles passing along the production line through each vehicles on-board diagnostics connector, which is operatively connected to the controller of each vehicle. As discussed herein, the electrical load measurement can be obtained from the controller of each vehicle through the OBD connector for each vehicle. Also the vehicle operating voltage measurement can be obtained from the controller for each vehicle through the OBD connector for each vehicle when the electrical load measurement of each vehicle is within a predetermined load range. The SOC value can then be determined for each vehicle on the production line based on the vehicle operating voltage measurement taken for each vehicle. Then each vehicle can be passed or failed based on the SOC value. Failed vehicles can undergo corrective action, such as battery replacement or battery charging.

Figure 5:
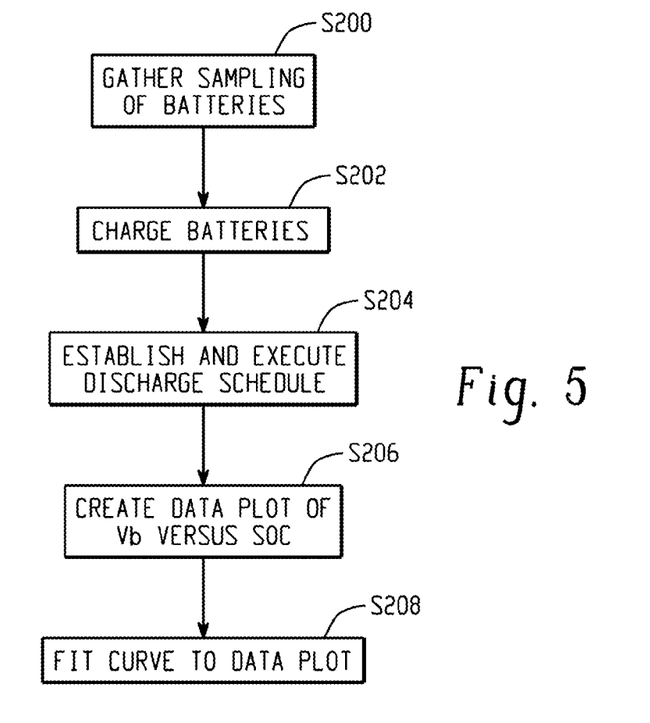
FIG. 5 is a block diagram of a method for establishing a battery load characteristic curve.

With reference now to FIG. 5, an exemplary method for establishing a specific battery load characteristic curve is shown. In particular, the method of FIG. 5 can be used to create a specific battery load characteristic curve for a particular battery or group of batteries. This could include a type of battery from a particular supplier and/or a particular size or group of sized batteries. In the illustrated method for establishing a specific load characteristic curve, a sampling of batteries is gathered in S200. The batteries can be those that will have the specific battery load characteristic curve associated therewith. For example, the sampling of batteries gathered in S200 can include batteries in original condition as provided from a supplier to a manufacturing facility and can be those batteries that would normally be installed in production vehicles. Next, the batteries gathered in S200 are equally charged in S202. For example, to equally charge the batteries gathered in S200, parallel combination of wires and terminals can be used to push an equivalent charge (e.g., 14.5 volt and 2-4 amp for battery trickle charged for 24 hours) to the batteries. Thereafter, though not shown in FIG. 5, the batteries can be allowed to stabilize for a predefined period of time, such as 24 hours.

Next, in S204, a discharge schedule can be established and executed for the batteries charged in S202. In one exemplary embodiment, the discharge schedule can be based on the CCA of the batteries as provided by the battery manufacturer. For example, a C5 rate can be used for discharging the batteries. The sampling of the batteries from S200 can be discharged at differing rates for purposes of creating a data plot of Vb versus state of charge (SOC). In particular, a data plot of Vb versus SOC can be created in S206 while the batteries gathered in S200 are discharged according to the discharge schedule of S204. Once a data plot of VB versus SOC is created in S206, a curve can be fit to the data plot in S208 where the curve is representative of the sampling of batteries and the curve correlates Vb to SOC.

Figure 6:
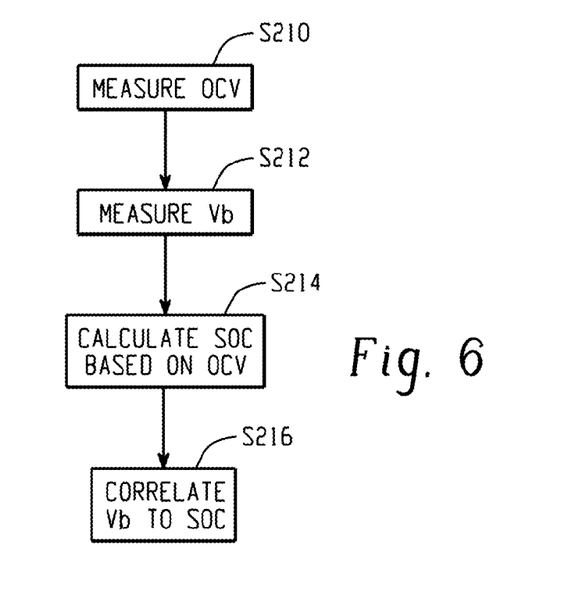
FIG. 6 is a block diagram of a method for creating a data plot of vehicle operating voltage while under load versus state of charge.

In an exemplary embodiment illustrated in FIG. 6, creating the data plot of Vb versus SOC can include measuring the open circuit voltage (OCV) of the batteries in S210 at select intervals as provided in the discharge schedule established in S204. Immediately after measuring OCV, Vb can be measured in S212 by installing the battery in a vehicle and measuring Vb as discussed hereinabove in reference to FIGS. 2 and/or 3. Next, SOC can be calculated in S214 based on the OCV measured in S210. For example, some battery manufacturers provide data for calculating SOC based on OCV, such as an equation that can be used to calculate SOC based on the OCV (e.g., $SOC = 87.494 \times OCV - 1024.5$). This can be particular to the battery or group of batteries selected in S200. With SOC calculated, Vb can be correlated in S216 to the calculated SOC from S214 for each discharge interval to create the data plot of Vb versus SOC. These steps S210, S212, S214 and S216 are done at each interval provided in the discharge schedule and for each battery gathered in S2100. With additional reference to FIG. 7, an exemplary data plot of Vb versus SOC is illustrated where data points DP are shown.

Figure 7:
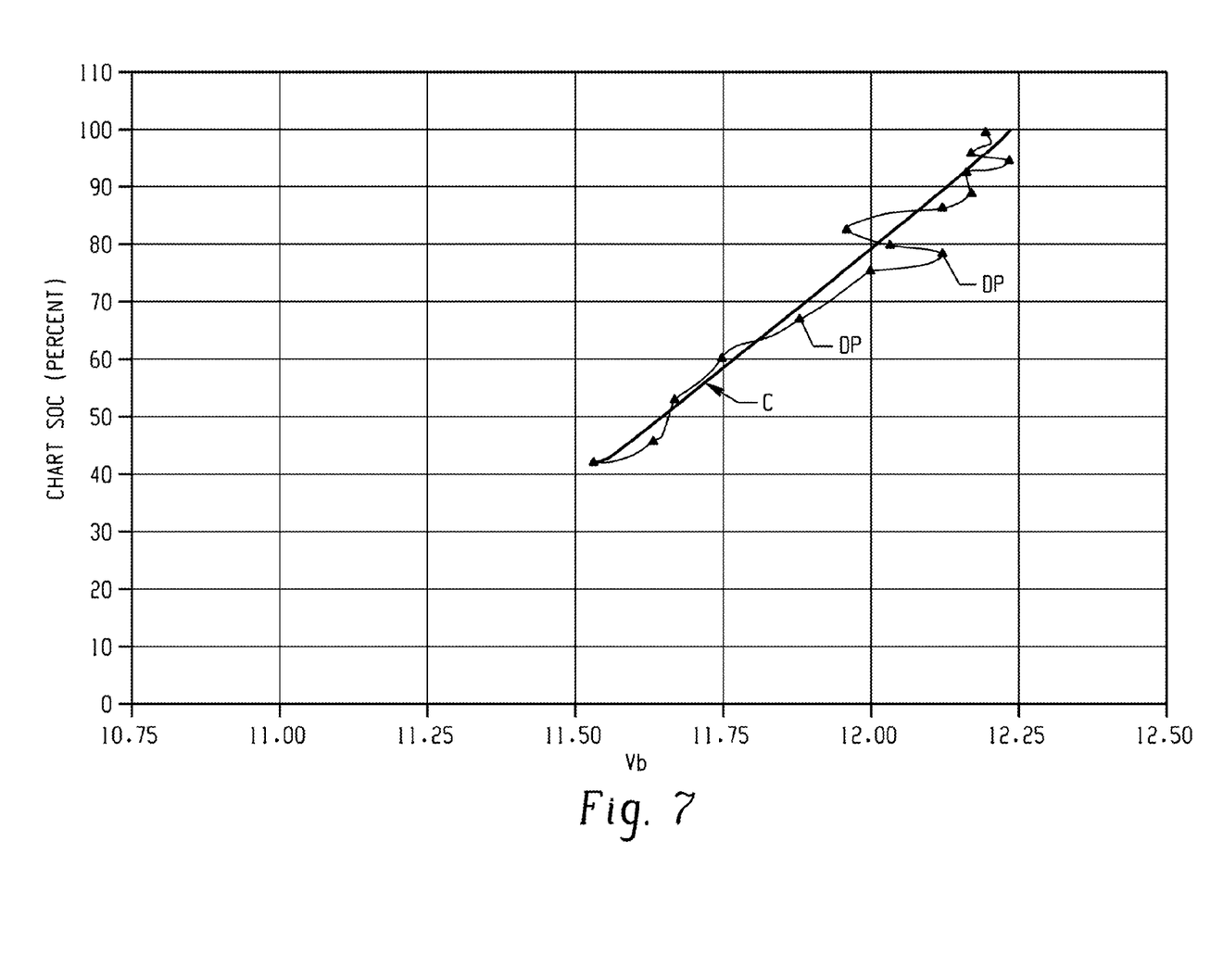
FIG. 7 is an exemplary data plot of vehicle operating voltage while under load versus state of charge and a curve fit to the data plot.

With the data plot established, a curve, such as curve C in FIG. 7, can be fit to the data plot in S208. This curve can be used by the tester 30, and more particularly, software thereof, for correlating a measured vehicle operating voltage Vb taken from the controller 14 through the connector 20 to SOC or a SOC percentage. Actual implementation can be through any equation, such as a quadratic equation, that is representative of the Vb versus SOC curve. This can be represented by look-up tables, a standard equation or other implementations. The curve allows Vb to be used to determine SOC (e.g., in S106 of FIG. 2 and/or in S144 of FIG. 3). The curve may be temperature specific and best used when a battery to be tested is at or near the same temperature as the batteries that were used to create the curve.

It is to be appreciated that in connection with the particular exemplary embodiments presented herein certain structural and/or functional features are described as being incorporated in defined elements and/or components. However, it is contemplated that these features may, to the same or similar benefit, also likewise be incorporated in common elements and/or components where appropriate. For example, the sensor 18 and the controller 14 may suitably be integrated together. It is also to be appreciated that different aspects of the exemplary embodiments may be selectively employed as appropriate to achieve other alternate embodiments suited for desired applications, the other alternate embodiments thereby realizing the respective advantages of the aspects incorporated herein.

It is also to be appreciated that particular elements or components described herein may have their functionality suitably implemented via hardware, software, firmware or a combination thereof. For example, the tester 30 may be implemented as appropriate hardware circuits or alternately as microprocessors programmed to implement their respective functions. Additionally, it is to be appreciated that certain elements described herein as incorporated together may under suitable circumstances be stand-alone elements or otherwise divided similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A battery confirmation method for confirming a state of charge in a vehicle battery installed in a vehicle, comprising:
connecting a tester to an onboard diagnostics connector of the vehicle;
obtaining an electrical load measurement representative of an electrical load on the battery from a controller of the vehicle through the onboard diagnostics connector;
obtaining a vehicle operating voltage from the onboard diagnostics connector only when the electrical load of the battery is within a predetermined load range wherein the vehicle operating voltage is a vehicle operating voltage measurement obtained through the onboard diagnostics connector from the controller, and
determining a state of charge (SOC) value based on the vehicle operating voltage.

2. The method of claim 1 wherein the vehicle operating voltage measurement is a voltage measurement taken while the battery is subjected to an electrical load condition.

3. The method of claim 1 further comprising:
providing a pass indication on the tester when the SOC value is greater than or equal to a predetermined SOC pass value and providing a fail indication on the tester when the SOC value is less than the predetermined SOC pass value.

4. The method of claim 3 wherein the electrical load measurement and the vehicle operating voltage measurement are taken while an engine of the vehicle is turned off and an ignition switch of the vehicle is turned to a run position or an accessory ON position.

5. The method of claim 1 further including:
adjusting an electrical load condition on the battery when the electrical load measurement is outside the predetermined load range until the electrical load measurement is within the predetermined load range.

6. The method of claim 5 wherein adjusting the electrical load condition on the battery includes automatically adjusting the electrical load condition, and further wherein automatically adjusting the electrical load condition includes sending a command signal from the tester to the controller through the onboard diagnostic connector, the controller changing the on/off state of one or more load devices of the vehicle in response to the command signal.

7. The method of claim 5 wherein adjusting the electrical load condition includes changing the on/off state of headlights on the vehicle for a predefined period of time.

8. The method of claim 7 wherein changing the on/off state of the headlights includes automatically changing the on/off state of the headlights to an ON state and the predetermined period of time is three seconds.

9. The method of claim 1 wherein determining the SOC value includes comparing the vehicle operating voltage measurement, which is taken while the electrical load measurement is within the predetermined load range, to a specific battery load characteristic curve corresponding to the vehicle battery.

10. The method of claim 9 wherein determining the SOC value further includes selecting the specific battery load characteristic curve from a plurality of battery load characteristic curves based on the battery in the vehicle.

11. The method of claim 1 wherein the predetermined load range is from about 13 A to about 19.5 A.

12. The method of claim 1 further including:
extracting a vehicle identification number (VIN) of the vehicle from the controller through the onboard diagnostics connector to the tester; and
associating the VIN extracted to the tester with the vehicle operating voltage measurement and the electrical load measurement of the battery as measured by the tester.

13. The method of claim 12 further including:
transferring the vehicle operating voltage measurement and the electrical load measurement of the battery with the associated VIN to an archive server.

14. The method of claim 1 further including:
charging the battery when the SOC value is below a predetermined SOC pass value prior to shipping the vehicle from a manufacturing facility.

15. A battery confirmation system for confirming a state of charge in a battery, comprising:
a vehicle having a controller, a battery powering the controller, and an onboard diagnostics connector operatively connected to the controller;

a tester connectable to the onboard diagnostics connector, the tester configured to receive the vehicle operating voltage from the connector when an electrical load on the battery is within a predetermined load range and to determine a state of charge (SOC) value based on the vehicle operating voltage; and a sensor obtaining an electrical load measurement on the battery representative of the electrical load and a vehicle operating voltage measurement representative of the vehicle operating voltage, wherein the tester communicates with the controller through the onboard diagnostics connector, the tester configured to receive the electrical load measurement taken by the sensor from the controller representative of the electrical load on the battery and to determine whether the electrical load measurement is within a predetermined load range.

16. The battery system of claim 15 wherein the tester is further configured to command the controller to adjust an electrical load condition on the battery when the electrical load measurement is outside the predetermined load range.

17. The battery system of claim 15 wherein the tester is further configured to receive a vehicle identification number (VIN) stored by the controller corresponding to the vehicle and associate the VIN number with the electrical load measurement and the vehicle operating voltage measurement, the system further including an archive server operatively connectable to the tester for receiving and archiving the VIN number, the electrical load measurement and the vehicle operating voltage measurement.

18. The battery system of claim 15 wherein the tester includes a display that displays a pass indication when the SOC value is greater than or equal to a predetermined SOC pass value and/or displays a fail indication when the SOC value is less than the predetermined SOC pass value.

19. The battery system of claim 15 wherein the tester is further configured to compare the vehicle operating voltage measurement to a specific battery load characteristic curve corresponding to the battery, the specific battery load characteristic curve selected from a plurality of battery load characteristic curves based on the battery in the vehicle.

20. A method for confirming state of charge in vehicles exiting a production line, comprising:
    connecting a line-end tester to a controller of each of the vehicles through an onboard diagnostics connector operatively connected to the controller;
    obtaining an electrical load measurement from the controller through the onboard diagnostics connector for each vehicle;
    obtaining a vehicle operating voltage measurement from the controller through the onboard diagnostics connector for each vehicle when the electrical load measurement is within a predetermined load range; and
    determining a state of charge (SOC) value for each vehicle based on the vehicle operating voltage measurement; and
    passing or failing each vehicle based on the SOC value.

21. The method of claim 20 further including:
    adjusting an electrical load condition on the battery when the electrical load condition is outside the predetermined load range until the electrical load measurement is within the predetermined load range.

* * * * *